United States Patent
Lee et al.

(10) Patent No.: US 10,153,440 B2
(45) Date of Patent: Dec. 11, 2018

(54) BLUE PHOSPHORESCENCE COMPOUND AND ORGANIC LIGHT EMITTING DIODE COMPRISING THE SAME

(71) Applicant: LG DISPLAY CO., LTD., Seoul (KR)

(72) Inventors: Seungjae Lee, Paju-si (KR); Inae Shin, Paju-si (KR); Hyeryoung Heo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 741 days.

(21) Appl. No.: 13/966,021

(22) Filed: Aug. 13, 2013

(65) Prior Publication Data

US 2014/0167001 A1    Jun. 19, 2014

(30) Foreign Application Priority Data

Dec. 17, 2012 (KR) .................... 10-2012-0147732

(51) Int. Cl.
| | |
|---|---|
| H01L 51/00 | (2006.01) |
| C09K 11/06 | (2006.01) |
| H05B 33/14 | (2006.01) |
| H01L 51/50 | (2006.01) |

(52) U.S. Cl.
CPC .......... *H01L 51/0085* (2013.01); *C09K 11/06* (2013.01); *H05B 33/14* (2013.01); *C09K 2211/1007* (2013.01); *C09K 2211/1029* (2013.01); *C09K 2211/1044* (2013.01); *C09K 2211/1059* (2013.01); *C09K 2211/185* (2013.01); *H01L 51/0059* (2013.01); *H01L 51/0067* (2013.01); *H01L 51/0072* (2013.01); *H01L 51/5016* (2013.01)

(58) Field of Classification Search
None
See application file for complete search history.

(56) References Cited

U.S. PATENT DOCUMENTS

| | | | |
|---|---|---|---|
| 2008/0038586 A1* | 2/2008 | Nishizeki | C09K 11/06 428/704 |
| 2011/0057559 A1* | 3/2011 | Xia | C07F 15/0033 313/504 |
| 2011/0084601 A1* | 4/2011 | Nakayama | C09K 11/06 313/504 |

FOREIGN PATENT DOCUMENTS

| | | | |
|---|---|---|---|
| JP | 2007051243 A | * | 3/2007 |
| JP | 2008074831 A | * | 4/2008 |

OTHER PUBLICATIONS

Machine English translation of JP 2007-051243 A. Mar. 3, 2016.*

(Continued)

*Primary Examiner* — Jay Yang
(74) *Attorney, Agent, or Firm* — Seed IP Law Group LLP

(57) ABSTRACT

A blue phosphorescence compound is disclosed. The blue phosphorescence compound represented by Chemical Formula 1 below.

[Chemical Formula 1]

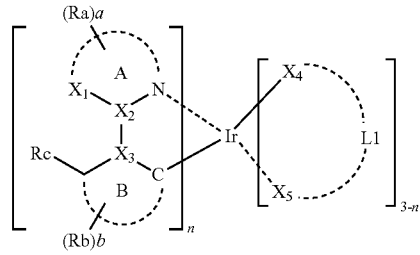

7 Claims, 2 Drawing Sheets

(56) References Cited

OTHER PUBLICATIONS

Machine English translation of Kido et al. (JP 2008-074831 A). Jun. 19, 2017.*

Zhuang, J. et al., "Homoleptic tris-cyclomentalated iridium(III) complexes with phenylimidazole ligands for highly efficient sky-blue OLEDs," *Royal Society of Chemistry, New J. Chem*, 39, 2015, pp. 246-253.

* cited by examiner

BLUE PHOSPHORESCENCE COMPOUND AND ORGANIC LIGHT EMITTING DIODE COMPRISING THE SAME

This application claims the priority benefit of Korean Patent Application No. 10-2012-0147732 filed on Dec. 17, 2012, which is incorporated herein by reference for all purposes as if fully set forth herein.

BACKGROUND

Field of the Disclosure

Embodiments of the disclosure relate to an organic light emitting diode, and more particularly, to an organic light emitting diode comprising a new blue phosphorescence compound.

Discussion of the Related Art

Recently, flat panel displays (FPDs) have grown in importance together with the development of the multimedia. Correspondingly to this trend, several kinds of displays, such as a liquid crystal display (LCD), a plasma display panel (PDP), a field emission display (FED), an organic light emitting diode, and the like are being commercialized.

The organic light emitting diode has advantages in that and it can have elements formed even on a flexible substrate such as plastic; can be driven at a low voltage of 10V or lower as compared with a plasma display panel or an inorganic light emitting diode; and can have a comparatively low power consumption and excellent feeling of color. Further, since the organic light emitting diode expresses three colors of red, green, and blue, it has attracted the attention of many people as a next generation display expressing full colors.

The organic light emitting diode may be manufactured by sequentially stacking an anode, a hole injection layer, a hole transport layer, a light emitting layer, an electron transport layer, an electron injection layer, and a cathode. As for the organic light emitting diode, holes injected from the anode and electrons injected from the cathode are recombined with each other to generate excitons, which are stabilized to a ground state to emit light. An exciton blocking layer having superior stability is often used to prevent the generated excitons from being quenched.

Singlet and triplet excitons exist at a ratio of 1:3. Only singlet excitons are used for fluorescence and both singlet and triplet excitons are used for phosphorescence, thereby obtaining superior luminous efficiency. As such, a phosphorescence material may have very high quantum efficiency as compared with a fluorescence material, and thus a lot of researches thereof are being conducted for methods of improving efficiency and lowering consumption power of the organic light emitting diode.

SUMMARY

Embodiments of the invention provide a blue phosphorescence compound and an organic light emitting diode comprising the same.

In one aspect, there is a blue phosphorescence compound represented by the following Chemical Formula 1,

[Chemical Formula 1]

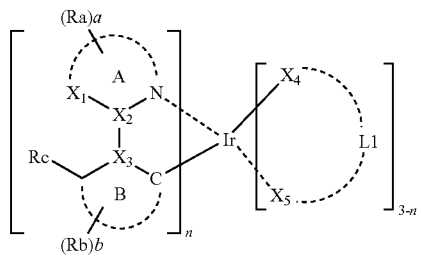

wherein, in Chemical Formula 1, $X_1$, $X_2$, and $X_3$ each are a nitrogen atom or a carbon atom; A is a 5- to 6-membered nitrogen-containing heteroaromatic group consisting of $X_1$—$X_2$—N; B is a 5- to 6-membered aromatic or heteroaromatic group consisting of $X_3$—C; $X_4$-L1-$X_5$ is a bidentate ligand; $X_4$ and $X_5$ each are independently a carbon atom, a nitrogen atom, or an oxygen atom; L1 is an atom group forming the bidentate ligand; n is an integer of 1 to 3; a is an integer of 0 to 3; b is an integer of 0 to 3; Ra and Rb each are independently one selected from hydrogen, D, halogens of F, Cl, and Br, $CF_3$, cyano groups, C1~C18 alkyl groups, C1~C18 alkoxy groups, C6 or more substituted or unsubstituted aromatic groups, C5 or more substituted or unsubstituted heteroaromatic groups, C1~C18 amine groups, amine groups substituted with C6 or more aromatic groups, amine groups substituted with C5 or more heteroaromatic groups, silyl groups substituted with C1~C18 alkyl groups or C6 or more aromatic groups, and silyl groups substituted with C5 or more heteroaromatic groups; and Rc is one selected from C3~C18 alkyl groups, C3~C18 alkoxy groups, C6 or more substituted or unsubstituted aromatic groups, C5 or more substituted or unsubstituted heteroaromatic groups, C3~C18 amine groups, amine groups substituted with C6 or more aromatic groups, amine groups substituted with C5 or more heteroaromatic groups, silyl groups substituted with C3~C18 alkyl or C6 or more aromatic groups, and silyl groups substituted with C5 or more heteroaromatic groups.

In one aspect, there is an organic light emitting diode comprising an organic film formed between an anode and a cathode, the organic light emitting diode comprising the blue phosphorescence compound.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
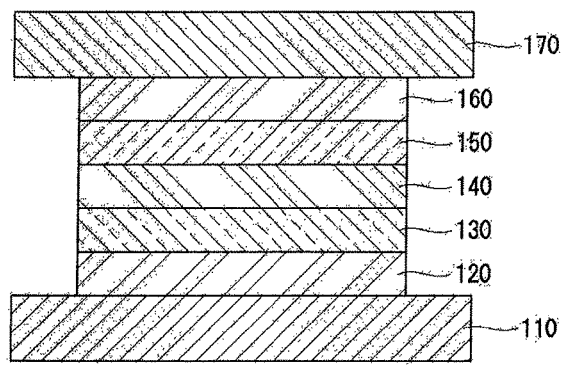
FIG. 1 is a view showing an organic light emitting diode according to an exemplary embodiment of the invention.

FIG. 1 is a view showing an organic light emitting diode according to an exemplary embodiment of the invention.

As shown in FIG. 1, an organic light emitting diode 100 according to an exemplary embodiment of the invention include an anode 110, a hole injection layer 120, a hole transport layer 130, a light emitting layer 140, an electron transport layer 150, an electron injection layer 160, and a cathode 170.

The anode 110, into which holes are injected, is formed of any one of indium tin oxide (ITO), indium zinc oxide (IZO), and zinc oxide (ZnO), which have a high work function. In addition, when the anode 110 is a reflective electrode, the anode 110 may further include a reflective layer of any one of aluminum (Al), silver (Ag), and nickel (Ni), below a layer of any one of ITO, IZO, and ZnO.

The hole injection layer 120 serves to facilitate the injection of holes into the light emitting layer 140 from the anode 110, and is formed of any one selected from the group consisting of cupper phthalocyanine (CuPc), poly(3,4)-ethylenedioxythiophene (PEDOT), polyaniline (PANI), and N,N-dinaphthyl-N,N'-diphenyl benzidine (NPD), but is not limited thereto.

The hole injection layer 120 has a thickness of 1 to 150 nm. Here, the hole injection layer 120 with a thickness of 1 nm or greater has an advantage of preventing the deterioration of hole injection characteristics, and the hole injection layer 120 with a thickness of 150 nm or smaller has an advantage of preventing the increase of driving voltage, which may be caused in order to improve the movement of holes when the hole injection layer 120 is too thick.

The hole transport layer 130 serves to facilitate the transport of holes, and is formed of any one selected from the group consisting of N,N-dinaphthyl-N,N'-diphenyl benzidine (NPD), N,N'-bis-(3-methylphenyl)-N,N'-bis-(phenyl)-benzidine (TDN), s-TAD, and 4,4',4''-tris(N-3-methylphenyl-N-phenyl-amino)-triphenylamine (MTDATA), but is not limited thereto.

The hole transport layer 130 has a thickness of 1 to 150 nm. Here, the hole transport layer 130 with a thickness of 5 nm or greater has an advantage of preventing the deterioration of hole transport characteristics, and the hole transport layer 130 with a thickness of 150 nm or smaller has an advantage of preventing the increase of driving voltage, which may be caused in order to improve the movement of holes when the hole transport layer 120 is too thick.

The light emitting layer 140 is formed of a material emitting blue light, and may be formed by using a phosphorescence material. In the present exemplary embodiment, the material emitting blue light will be described.

The light emitting layer 140 of the invention is formed of a blue phosphorescence compound represented by Chemical Formula 1 below:

[Chemical Formula 1]

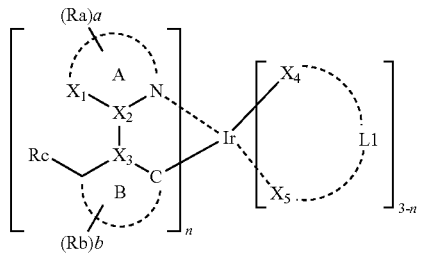

wherein, in Chemical Formula 1, $X_1$, $X_2$, and $X_3$ each are a nitrogen atom or a carbon atom; A is a 5- to 6-membered nitrogen-containing heteroaromatic group consisting of $X_1$—$X_2$—N; and B is a 5- to 6-membered aromatic or heteroaromatic group consisting of $X_3$—C; $X_4$-L1-$X_5$ is a bidentate ligand; $X_4$ and $X_5$ each are independently a carbon atom, a nitrogen atom, or an oxygen atom; L1 is an atom group forming the bidentate ligand; n is an integer of 1 to 3; a is an integer of 0 to 3; and b is an integer of 0 to 3; Ra and Rb each are independently one selected from hydrogen, D, halogens of F, Cl, and Br, $CF_3$, cyano groups, C1~C18 alkyl groups, C1~C18 alkoxy groups, C6 or more substituted or unsubstituted aromatic groups, C5 or more substituted or unsubstituted heteroaromatic groups, C1~C18 amine groups, amine groups substituted with C6 or more aromatic groups, amine groups substituted with C5 or more heteroaromatic groups, silyl groups substituted with C1~C18 alkyl groups or C6 or more aromatic groups, and silyl groups substituted with C5 or more heteroaromatic groups; and Rc is one selected from C3~C18 alkyl groups, C3~C18 alkoxy groups, C6 or more substituted or unsubstituted aromatic groups, C5 or more substituted or unsubstituted heteroaromatic groups, C3~C18 amine groups, amine groups substituted with C6 or more aromatic groups, amine groups substituted with C5 or more heteroaromatic groups, silyl groups substituted with C3~C18 alkyl or 06 or more aromatic groups, and silyl groups substituted with C5 or more heteroaromatic groups.

The blue phosphorescence compound is represented by any one of Chemical Formulas below.

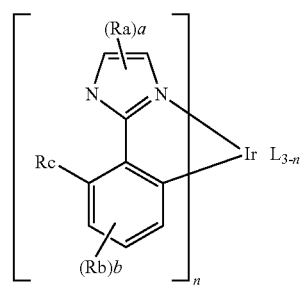

A-1

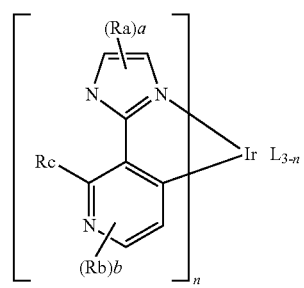

A-2

A-3 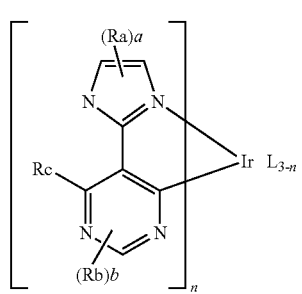
A-4 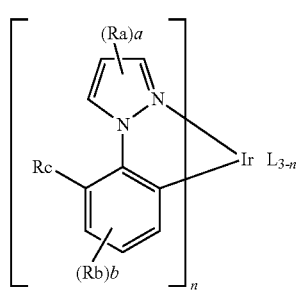
A-5 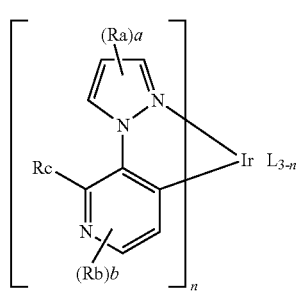
A-6 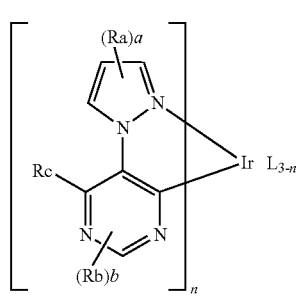
A-7 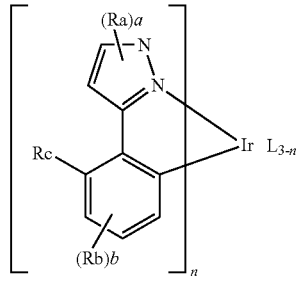
A-8 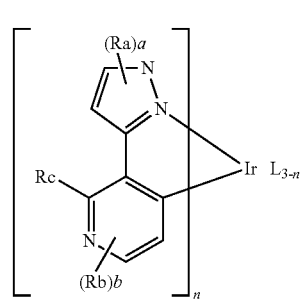
A-9 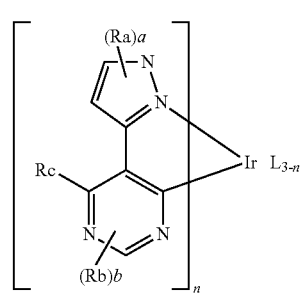
A-10 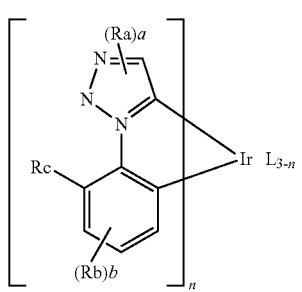
A-11 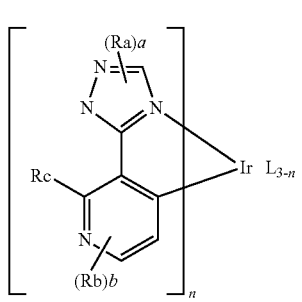
A-12 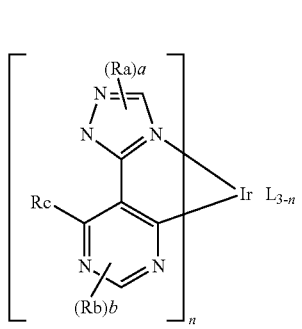

A-13 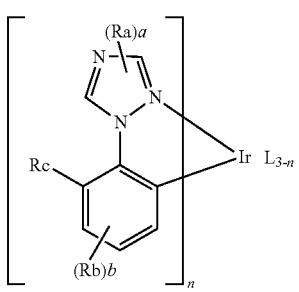

A-14 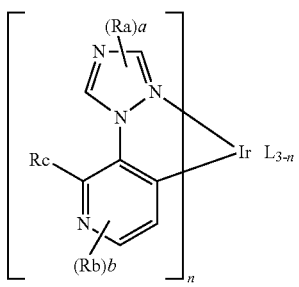

A-15 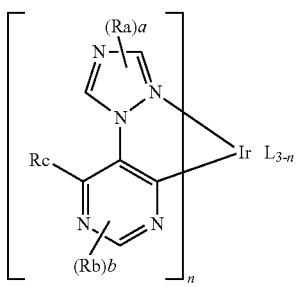

A-16 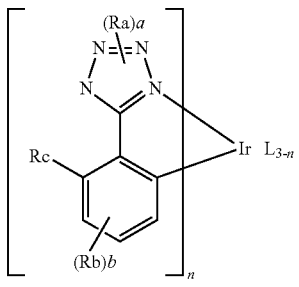

A-17 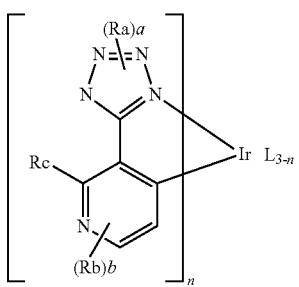

A-18 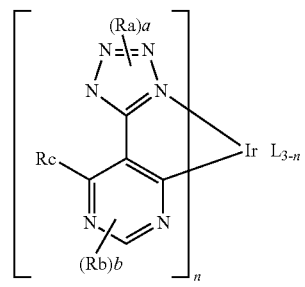

Here, a is an integer of 0 to 3; b is an integer of 0 to 3; Ra and Rb each are independently one selected from hydrogen, D, halogens of F, Cl, and Br, CF$_3$, cyano groups, C1~C18 alkyl groups, C1~C18 alkoxy groups, C6 or more substituted or unsubstituted aromatic groups, C5 or more substituted or unsubstituted heteroaromatic groups, C1~C18 amine groups, amine groups substituted with C6 or more aromatic groups, amine groups substituted with C5 or more heteroaromatic groups, silyl groups substituted with C1~C18 alkyl groups or C6 or more aromatic groups, and silyl groups substituted with C5 or more heteroaromatic groups; and Rc is one selected from C3~C18 alkyl groups, C3~C18 alkoxy groups, C6 or more substituted or unsubstituted aromatic groups, C5 or more substituted or unsubstituted heteroaromatic groups, C3~C18 amine groups, amine groups substituted with C6 or more aromatic groups, amine groups substituted with C5 or more heteroaromatic groups, silyl groups substituted with C3~C18 alkyl or C6 or more aromatic groups, and silyl groups substituted with C5 or more heteroaromatic groups.

Therefore, the blue phosphorescence compound is represented by any one of Chemical Formulas below.

B-1 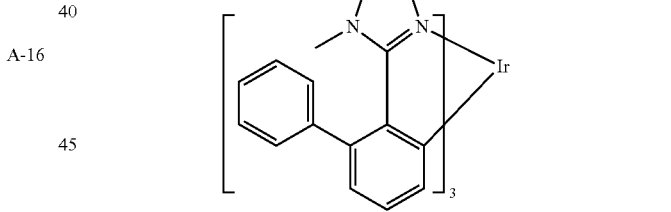

B-2 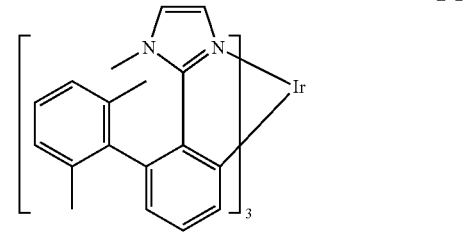

B-3 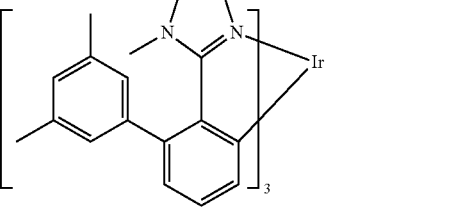

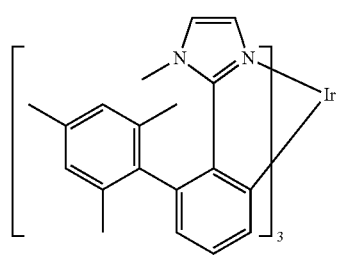
B-4
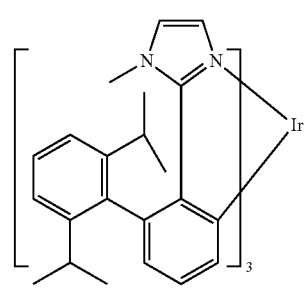
B-5
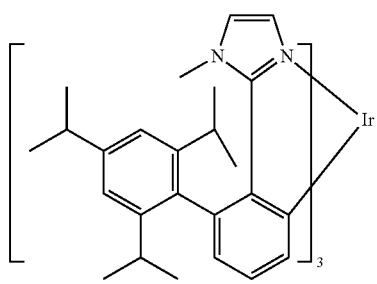
B-6
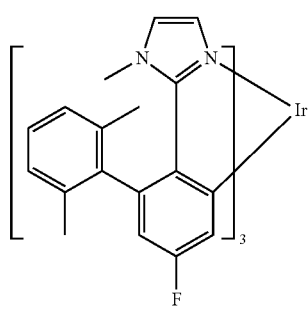
B-7
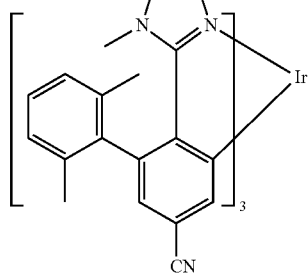
B-8
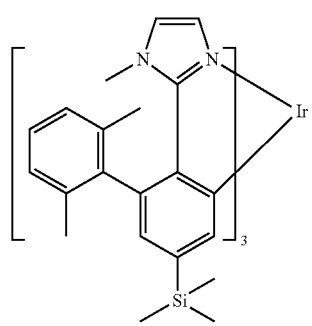
B-9
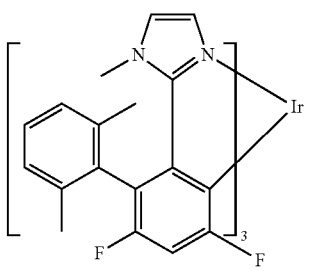
B-10
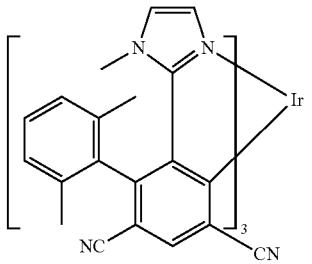
B-11
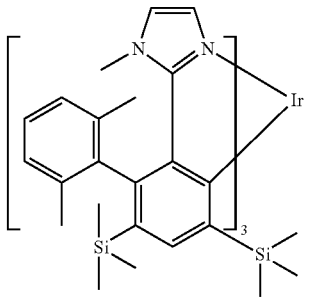
B-12
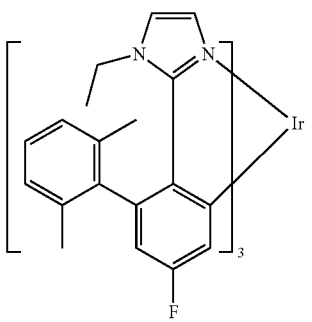
B-13

-continued
B-14
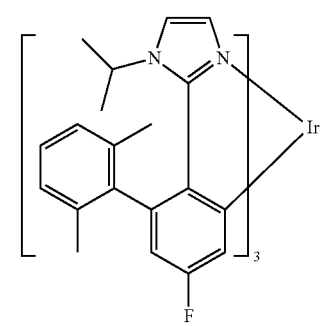
B-15
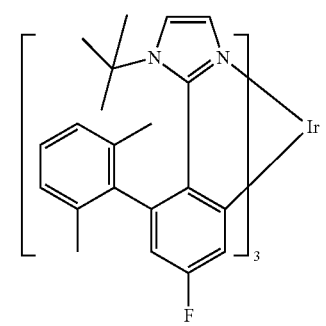
B-16
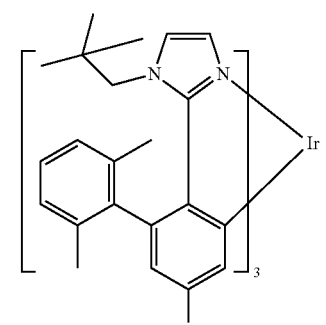
B-17
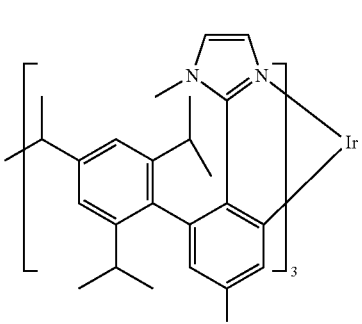
B-18
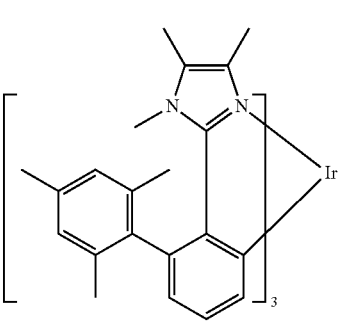
-continued
B-19
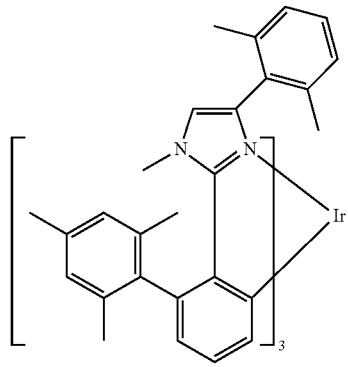
B-20
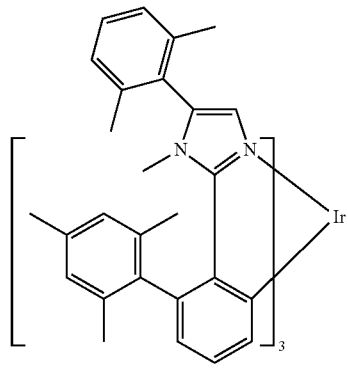
B-21
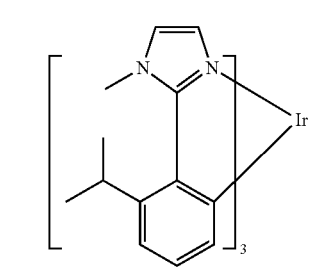
B-22
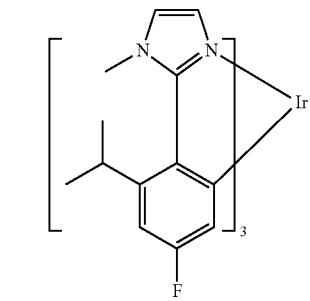
B-23
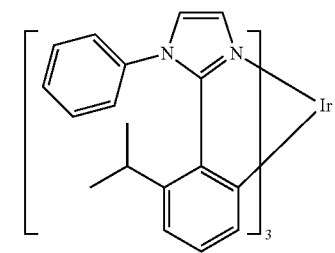

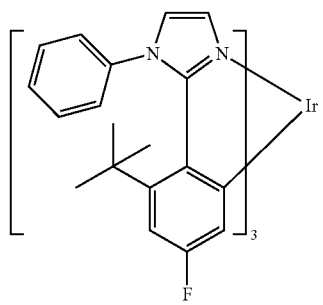 B-24
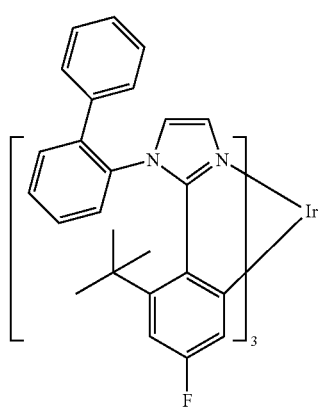 B-25
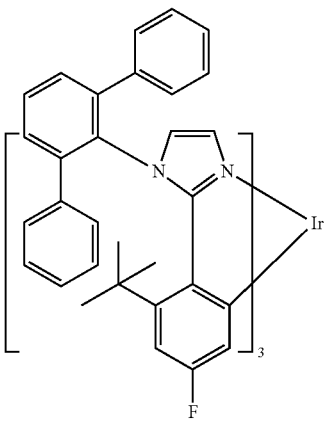 B-26
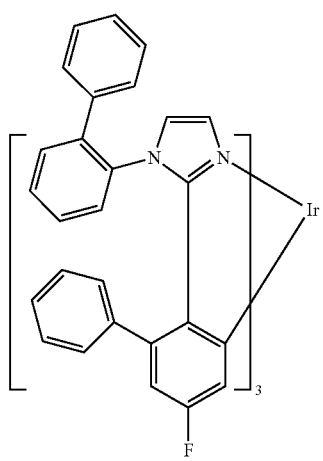 B-27
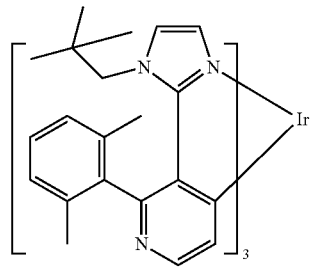 B-28
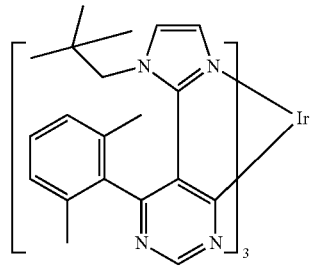 B-29
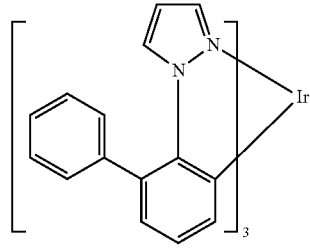 B-30
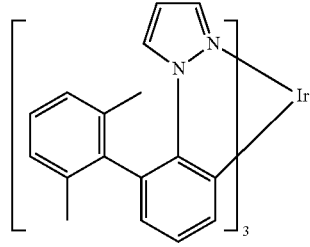 B-31
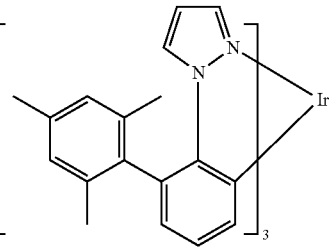 B-32
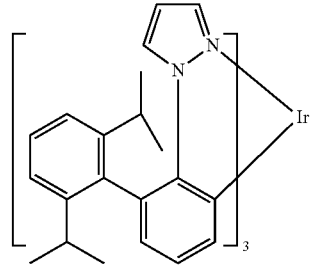 B-33

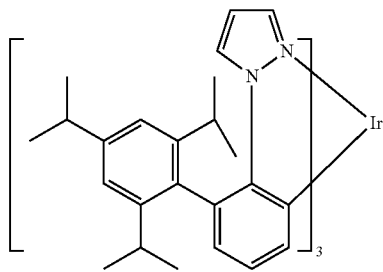 B-34
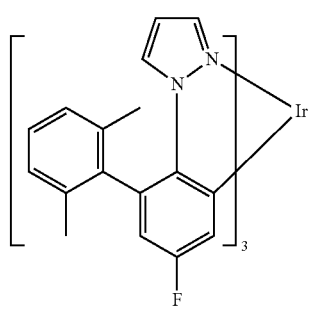 B-35
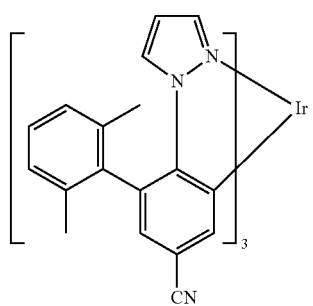 B-36
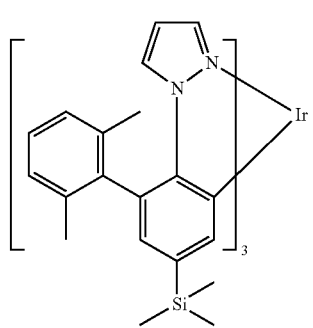 B-37
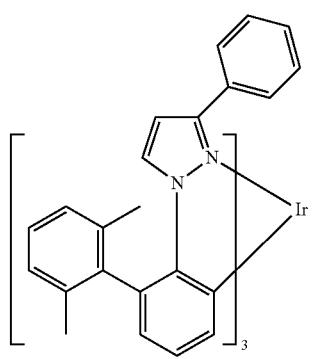 B-38
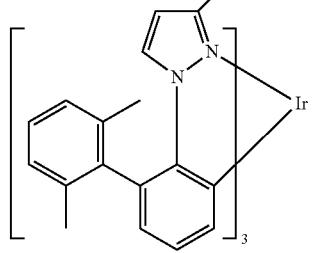 B-39
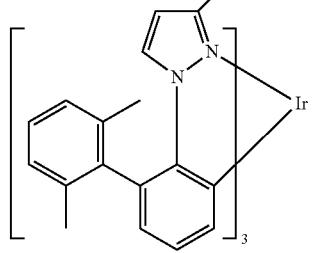 B-40
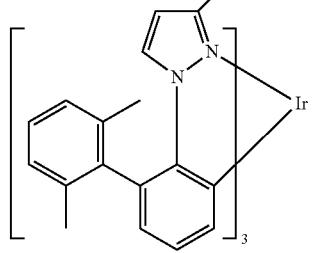 B-41
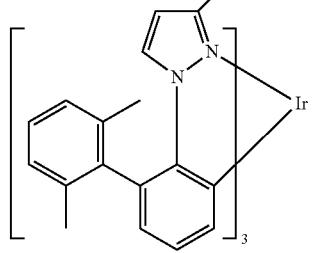 B-42
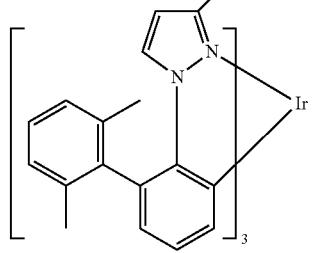 B-43

B-44
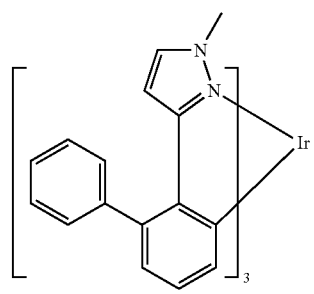
B-45
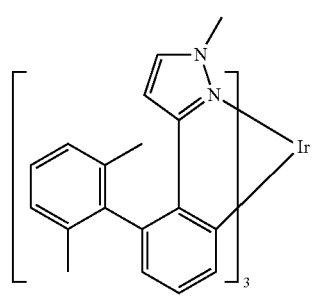
B-46
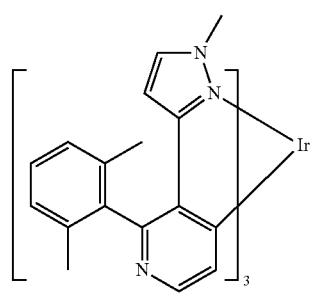
B-47
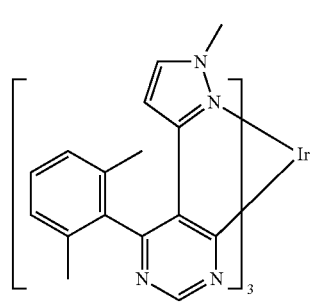
B-48
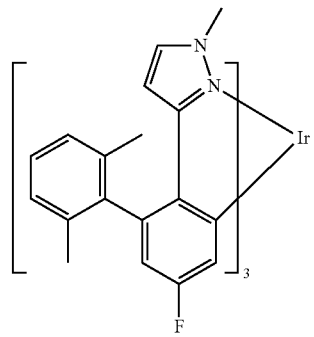
B-49
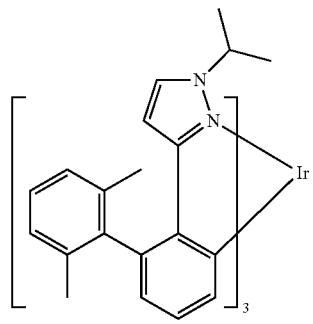
B-50
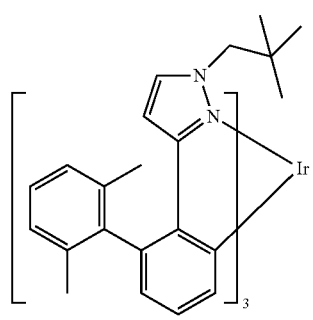
B-51
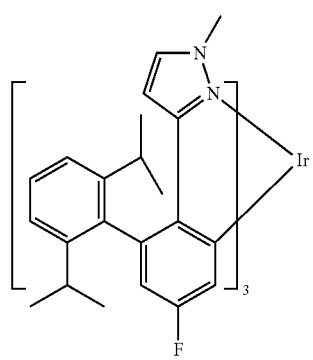
B-52
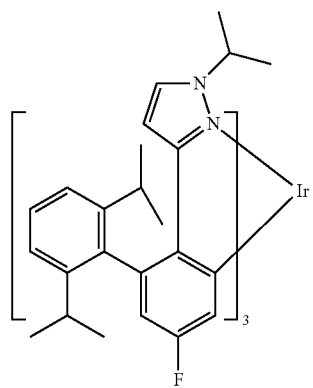

B-53 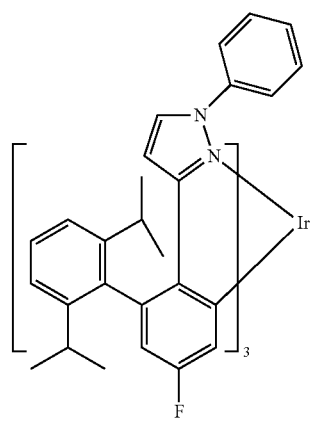
B-54 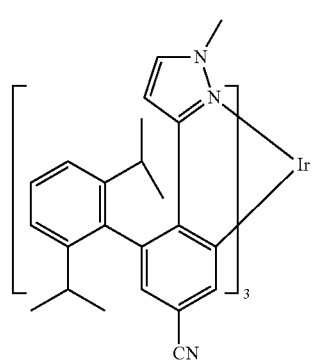
B-55 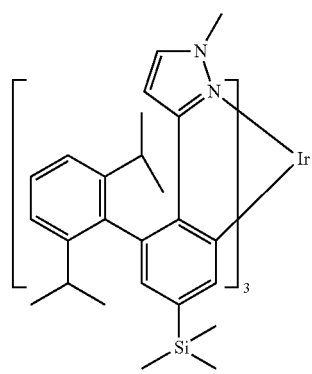
B-56 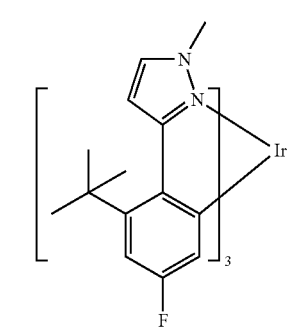
B-57 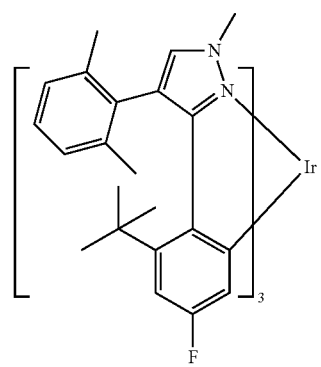
B-58 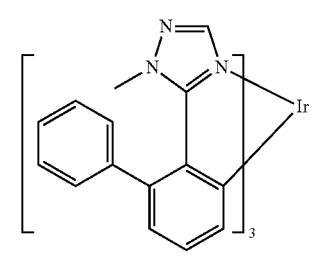
B-59 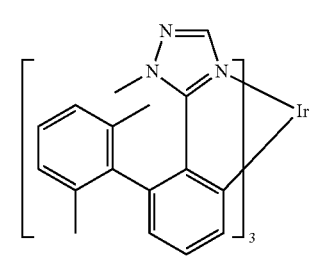
B-60 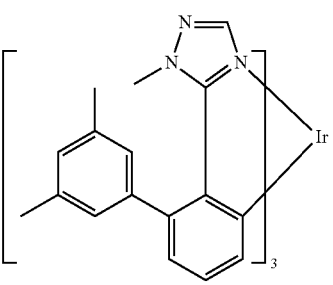
B-61 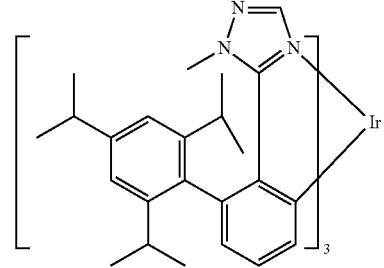

B-62 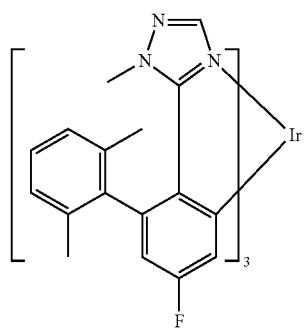
B-63 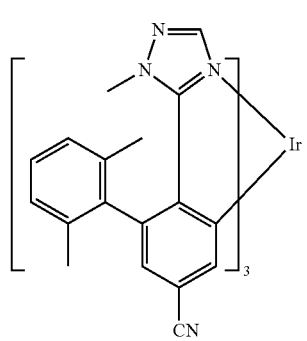
B-64 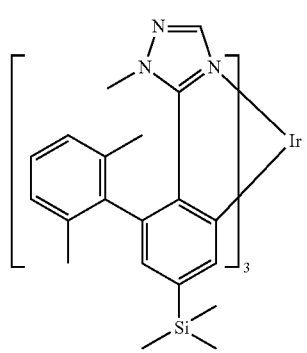
B-65 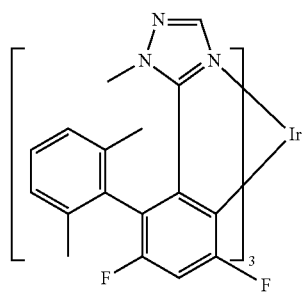
B-66 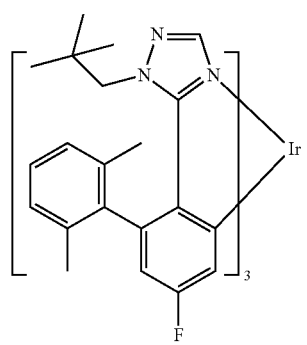
B-67 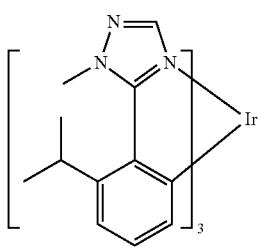
B-68 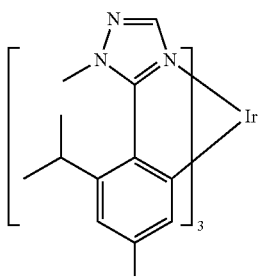
B-69 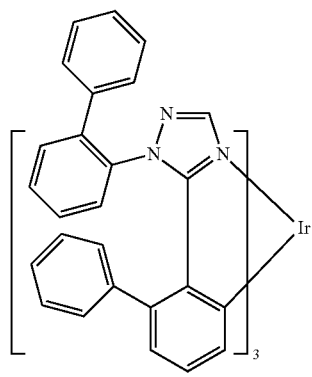
B-70 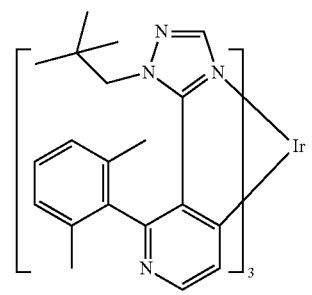
B-71 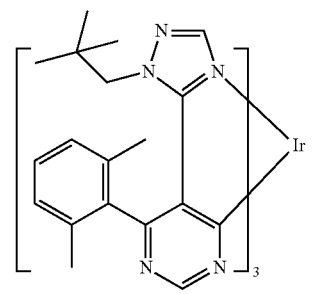

-continued
B-72
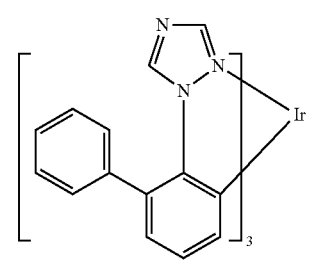
B-73
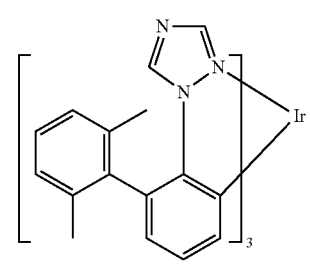
B-74
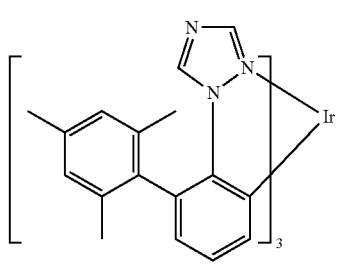
B-75
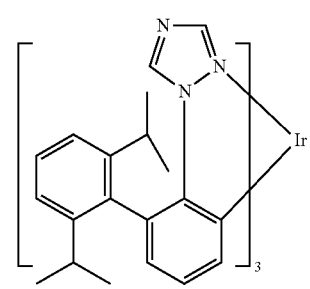
B-76
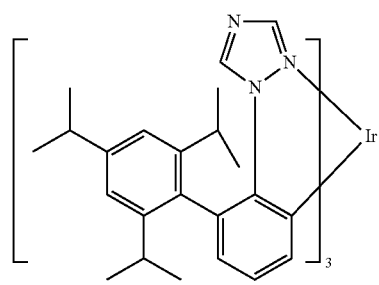
-continued
B-77
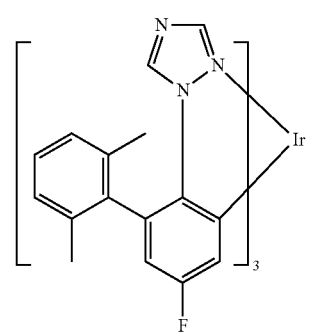
B-78
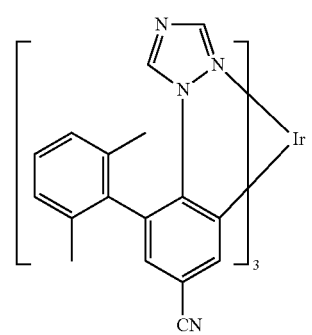
B-79
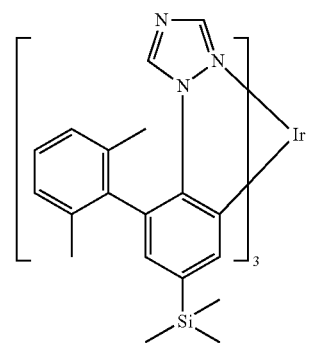
B-80
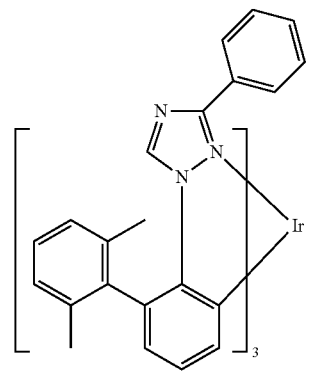

-continued
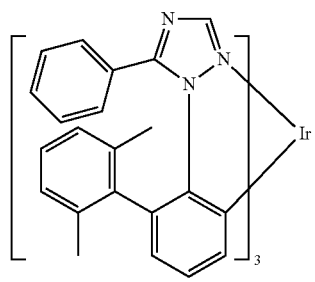
B-81
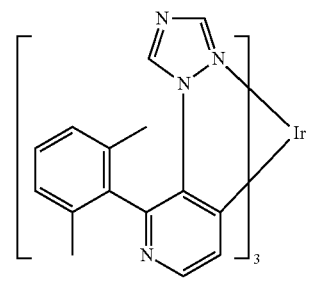
B-82
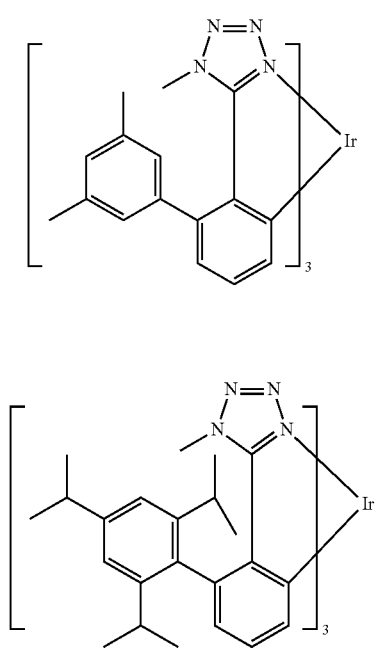
B-83
B-84
B-85
-continued
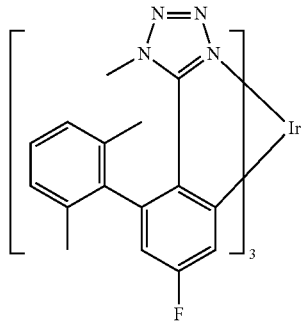
B-86
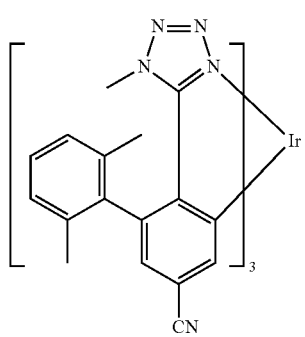
B-87
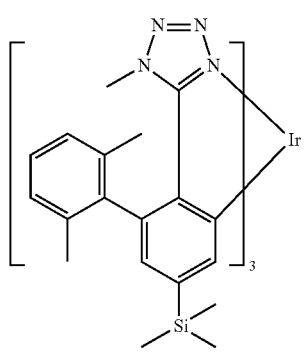
B-88
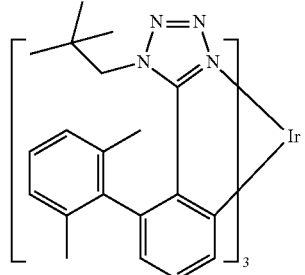
B-89
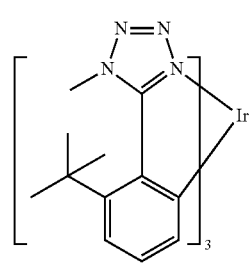
B-90

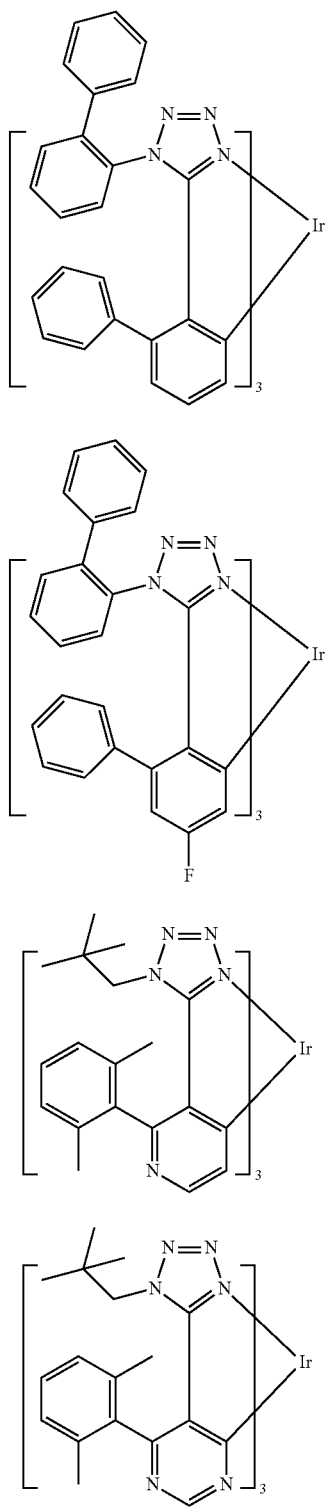

B-91

B-92

B-93

B-94

The blue phosphorescence compound is used as a dopant of the light emitting layer 140. When the blue phosphorescence compound is used as a dopant, it may be doped in the light emitting layer at a weight ratio of 0.1 to 50% or may be doped at a weight ratio of 1 to 20%.

The electron transport layer 150 serves to facilitate the transport of electrons, and is formed of any one selected from the group consisting of Alq3 (tris(8-hydroxyquinolino) aluminum), PBD, TAZ, spiro-PBD, BAlq, and SAlq, but is not limited thereto.

The electron transport layer 150 has a thickness of 1 to 50 nm. Here, the electron transport layer 150 with a thickness of 1 nm or greater has an advantage of preventing the deterioration of electron transport characteristics, and the electron transport layer 160 with a thickness of 150 nm or smaller has an advantage of preventing the increase of driving voltage, which may be caused in order to improve the movement of electrons when the electron transport layer 150 is too thick.

The electron injection layer 160 serves to facilitate the injection of electrons, and is formed of any one selected from the group consisting of Alq3 (tris(8-hydroxyquinolino) aluminum), PBD, TAZ, Spiro-PBD, BAlq, and SAlq, but is not limited thereto.

The electron injection layer 160 has a thickness of 1 to 50 nm. Here, the electron injection layer 160 with a thickness of 1 nm or greater has an advantage of preventing the deterioration of electron injection characteristics, and the electron injection layer 160 with a thickness of 150 nm or smaller has an advantage of preventing the increase of driving voltage, which may be caused in order to improve the movement of electrons when the electron injection layer 160 is too thick.

The cathode 170 is an electron injection electrode, and is formed of magnesium (Mg), calcium (Ca), aluminum (Al), silver (Ag), or an alloy thereof, having a low work function. Here, the cathode 170 may be thin enough to transmit light therethrough when the organic light emitting diode has a top emission type or a double emission type, and may be thick enough to reflect light therefrom when the organic light emitting diode has a back emission type.

Hereinafter, the blue phosphorescence compound and the organic light emitting diode including the same of the present invention will be described with reference to synthetic examples and examples below. However, the examples below are for merely exemplifying the invention, and therefore, the scope of the invention is not limited thereto.

SYNTHETIC EXAMPLE 1

Synthesis of Blue Phosphorescence Compound Represented by B-7

1) Synthesis of Compound A1

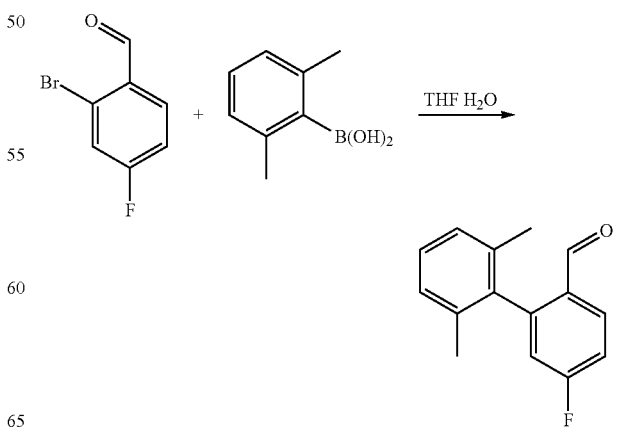

A1

In a 500 ml round bottom flask, 2-bromo-4-fluorobenzaldehyde (10.00 g, 49.26 mmol), 2,6-dimethylphenylboronic acid (8.87 g, 59.11 mmol), tetrakis(triphenylphosphine)palladium(0) (2.85 g, 2.46 mmol), and potassium carbonate (29.96 g, 216.74 mmol) were added to a mixture liquid of tetrahydrofuran (THF, 150 ml) and water (50 ml), followed by reflux for 24 hours. The temperature was lowered to room temperature, followed by removal of tetrahydrofuran (THF), extraction with dichloromethane and water, concentration of the solution, and then column chromatography using methylene chloride and hexane, thereby obtaining Compound A1 (7.12 g, 31.19 mmol).

2) Synthesis of Compound A2

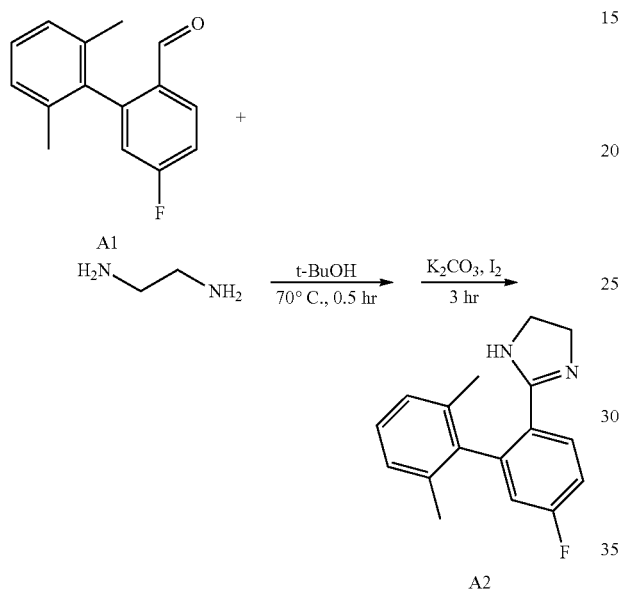

Compound A1 (7.00 g, 30.67 mmol) and ethylenediamine (2.03 g, 33.73 mmol) were put into a 250 ml round bottom flask, and then dissolved in tert-butanol (150 ml), followed by heating at 70□ for 30 minutes. After that, potassium carbonate (12.72 g, 92.00 mmol) and iodine (9.73 g, 38.33 mmol) were added thereto, followed by reflux for further 3 hours. The temperature was lowered to room temperature, followed by quenching with sodium carbonate, extraction with ethylene acetate and water, and then concentration of the solution. The concentrated compound was dissolved in methylene chloride, and then the pH value was adjusted to 12~14 by using an aqueous solution of sodium hydroxide, followed by re-extraction, concentration of the solution, precipitation using methylene chloride and petroleum ether, and reduced pressure filtration, thereby obtaining Compound A2 (4.05 g, 15.09 mmol).

3) Synthesis of Compound A3

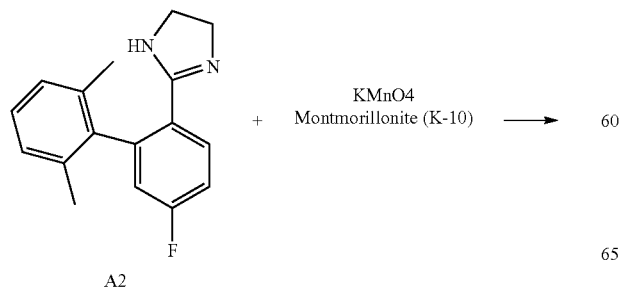

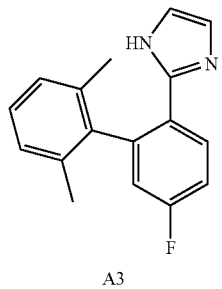

In a 250 ml round bottom flask, Compound A2 (4.05 g, 15.09 mmol) was dissolved in acetonitrile (150 ml), and then a mixture of potassium permanganate (5.96 g, 37.73 mmol) and montmorillonite K-10 (11.93 g) was slowly added thereto at room temperature. The resultant solution was stirred for 10 minutes at room temperature, and then the reaction was completed by adding ethanol thereto. Filtration was carried out by using ethyl acetate through cellite, followed by concentration of the solution and then column chromatography using ethyl acetate and hexane, thereby obtaining Compound A3 (2.05 g, 7.70 mmol).

4) Synthesis of Compound A4

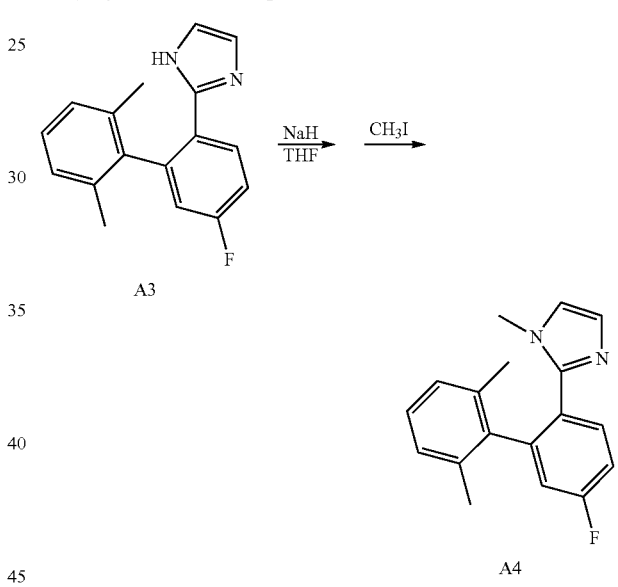

In a 250 ml round bottom flask, Compound A3 (2.05 g, 7.70 mmol) was dissolved in tetrahydrofuran (THF, 40 ml), and then sodium hydride (0.51 g, 21.25 mmol) was added thereto, followed by reflux for 1 hour. After that, methylene iodide (1.31 g, 9.23 mmol) was added thereto, followed by reflux for further 3 hours. The reaction was completed by adding water thereto, followed by extraction with ethyl acetate, concentration of the solution, and column chromatography using ethyl acetate and hexane, thereby obtaining Compound A4 (1.51 g, 5.39 mmol).

5) Synthesis of Compound B-7

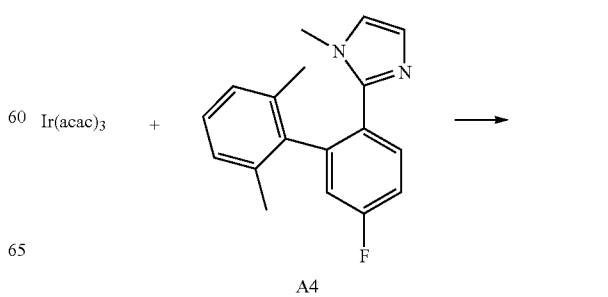

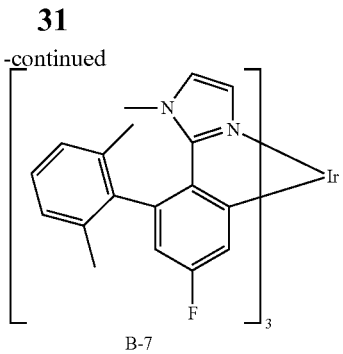

B-7

After Compound A4 (1.51 g, 5.39 mmol) and iridium (III) acetylacetonate (0.53 g, 1.08 mmol) were put into a 25 ml round bottom flask, the reaction mixture was vacuum-dried for 30 minutes, and the reaction flask was filled with a nitrogen gas (repeated three times). The reaction mixture was reacted at 240☐ for 48 hours, and then the temperature was lowered to room temperature, followed by filtration using methanol. The filtered precipitate was dissolved in methylene chloride, followed by column chromatography using hexane. After that, precipitation was carried out by using methylene chloride and methanol, followed by reduced pressure filtration, thereby synthesizing Compound B-7 (0.27 g, 0.26 mmol)

SYNTHETIC EXAMPLE 2

Synthesis of Blue Phosphorescence Compound Represented by B-13

1) Synthesis of Compound A11

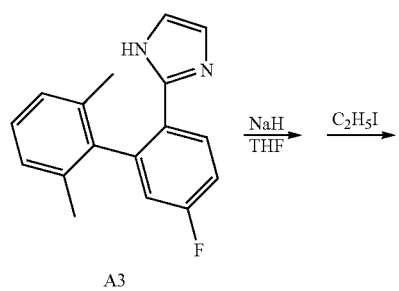

A3

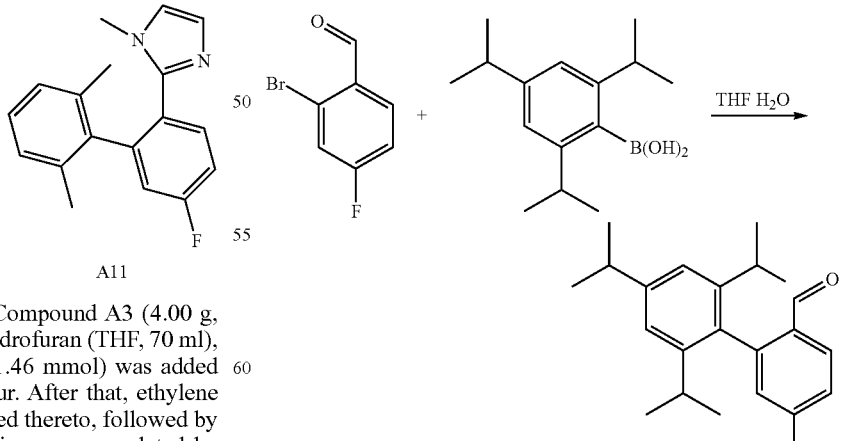

A11

In a 250 ml round bottom flask, Compound A3 (4.00 g, 15.02 mmol) was dissolved in tetrahydrofuran (THF, 70 ml), and then sodium hydride (0.99 g, 41.46 mmol) was added thereto, followed by reflux for 1 hour. After that, ethylene iodide (2.81 g, 18.02 mmol) was added thereto, followed by reflux for further 3 hours. The reaction was completed by adding water thereto, followed by extraction with ethyl acetate, concentration of the solution, and column chromatography using ethyl acetate and hexane, thereby obtaining Compound A11 (2.02 g, 6.86 mmol).

2) Synthesis of Compound B-13

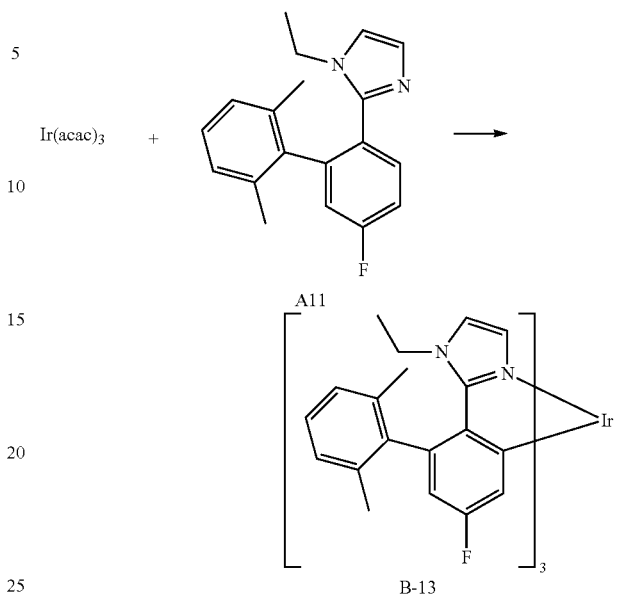

B-13

After compound A11 (2.02 g, 6.86 mmol) and iridium (III) acetylacetonate (0.67 g, 1.37 mmol) were put into a 25 ml round bottom flask, the reaction mixture was vacuum-dried for 30 minutes, and the reaction flask was filled with a nitrogen gas (repeated three times). The reaction mixture was reacted at 240☐ for 48 hours, and then the temperature was lowered to room temperature, followed by filtration using methanol. The filtered precipitate was dissolved in methylene chloride, followed by column chromatography using hexane. After that, precipitation was carried out by using methylene chloride and methanol, followed by reduced pressure filtration, thereby synthesizing Compound B-13 (0.31 g, 0.29 mmol).

SYNTHETIC EXAMPLE 3

Synthesis of Blue Phosphorescence Compound Represented by B-17

1) Synthesis of Compound A21

In a 500 ml round bottom flask, 2-bromo-4-fluorobenzaldehyde (10.00 g, 49.26 mmol), 2,4,6-triisopropylphenylboronic acid (14.67 g, 59.11 mmol), tetrakis(triphenylphosphine)palladium(0) (2.85 g, 2.46 mmol), and potassium carbonate (29.96 g, 216.74 mmol) were added to a mixture liquid of tetrahydrofuran (THF, 150 ml) and water (50 ml), followed by reflux for 24 hours. After the temperature was lowered to room temperature, tetrahydrofuran was removed, followed by extraction with dichloromethane and water, concentration of the solution, and column chromatography using methylene chloride and hexane, thereby obtaining Compound A21 (11.50, 35.23 mmol).

2) Synthesis of Compound A22

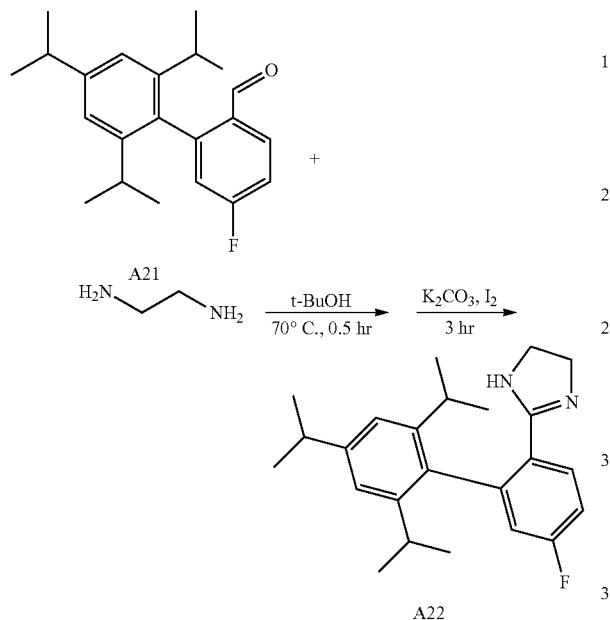

Compound A21 (11.50 g, 35.23 mmol) and ethylenediamine (2.33 g, 38.75 mmol) were put into a 250 ml round bottom flask, and then melted in tert-butanol (170 ml), followed by heating at 70□ for 30 minutes. After that, potassium carbonate (14.61 g, 105.68 mmol) and iodine (11.18 g, 44.03 mmol) were added thereto, followed by reflux for further 3 hours. The temperature is lowered to room temperature, followed by quenching with sodium carbonate, extraction with ethylene acetate and water, and concentration of the solution. The concentrated compound was dissolved in methylene chloride, and then the pH value was adjusted to 12~14 by using an aqueous solution of sodium hydroxide, followed by re-extraction, concentration of the solution, precipitation using methylene chloride and petroleum ether, and then reduced pressure filtration, thereby obtaining Compound A22 (7.01 g, 19.13 mmol).

3) Compound A23

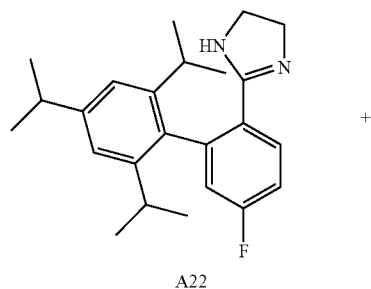

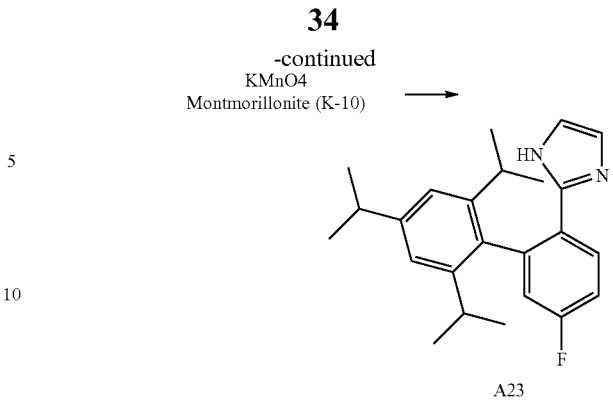

In a 250 ml round bottom flask, Compound A22 (7.01 g, 19.13 mmol) was dissolved in acetonitrile (180 ml), and then a mixture of potassium permanganate (7.56 g, 47.82 mmol) and montmorillonite K-10 (15.11 g) was slowly added thereto at room temperature. The resultant solution was stirred for 10 minutes at room temperature, and then the reaction was completed by adding ethanol thereto. Filtration was carried out by using ethyl acetate through cellite, followed by concentration of the solution and then column chromatography using ethyl acetate and hexane, thereby obtaining Compound A23 (3.65 g, 10.01 mmol).

4) Synthesis of Compound A24

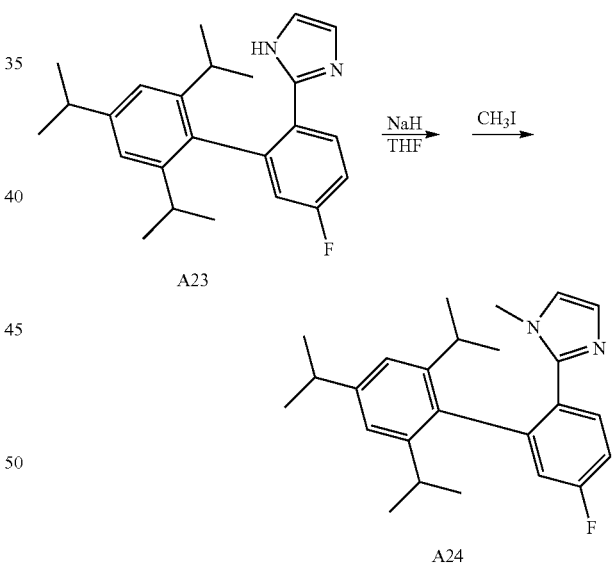

In a 250 ml round bottom flask, Compound A23 (3.65 g, 10.01 mmol) was dissolved in tetrahydrofuran (60 ml), and then sodium hyride (0.66 g, 27.64 mmol) was added thereto, followed by reflux for 1 hour. After that, methylene iodide (1.71 g, 12.02 mmol) was added thereto, followed by reflux for further 3 hours. The reaction was completed by adding water thereto, followed by extraction with ethyl acetate, concentration of the solution, and column chromatography using ethyl acetate and hexane, thereby obtaining Compound A24 (2.50 g, 6.60 mmol).

5) Synthesis of Compound B-17

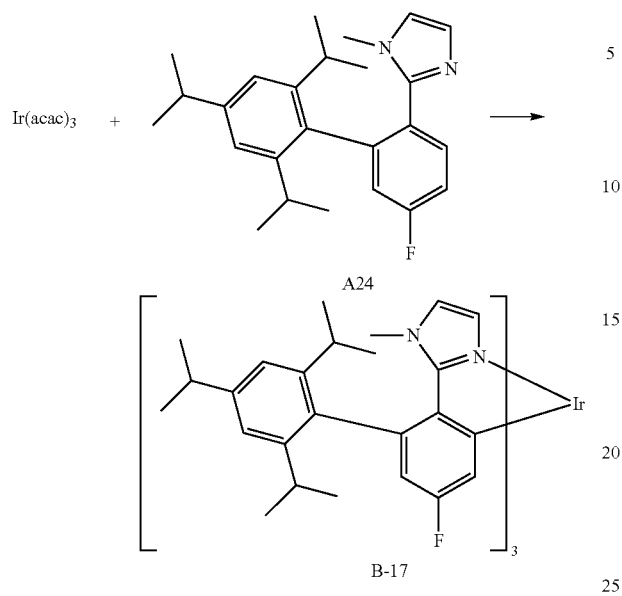

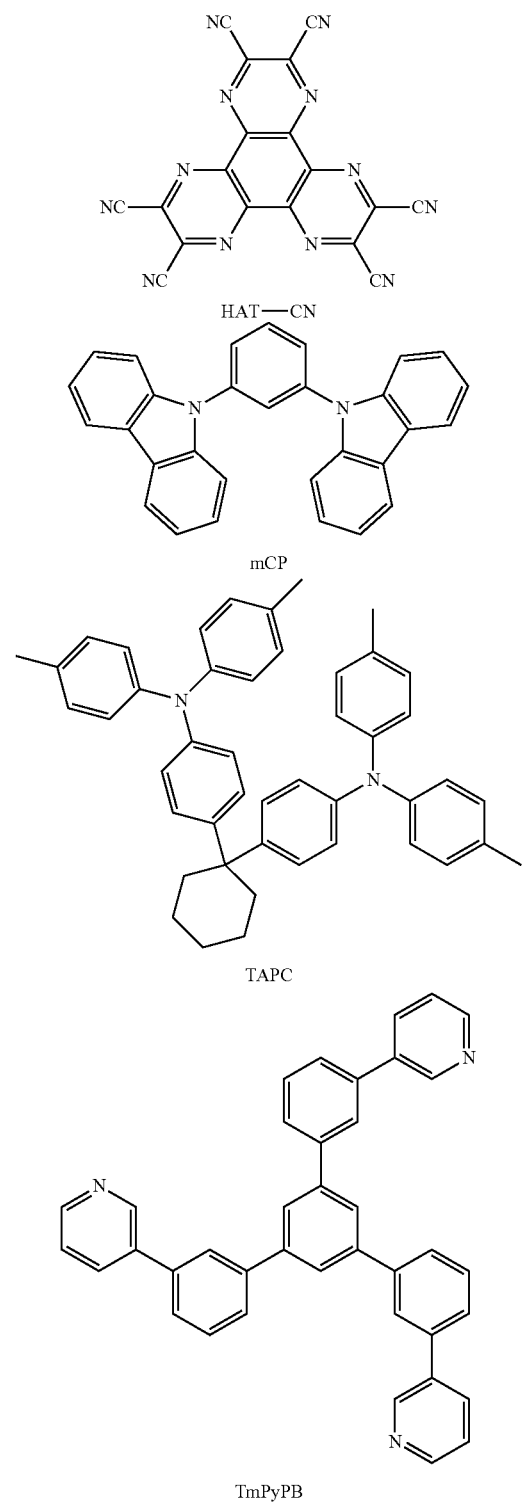

After compound A24 (2.50 g, 6.60 mmol) and iridium (III) acetylacetonate (0.65 g, 1.33 mmol) were put into a 25 ml round bottom flask, the reaction mixture was vacuum-dried for 30 minutes, and the reaction flask was filled with a nitrogen gas (repeated three times). The reaction mixture was reacted at 240☐ for 48 hours, and then the temperature was lowered to room temperature, followed by filtration using methanol. The filtered precipitate was dissolved in methylene chloride, followed by column chromatography using hexane. After that, precipitation was carried out by using methylene chloride and methanol, followed by reduced pressure filtration, thereby synthesizing Compound B-17 (0.31 g, 0.23 mmol).

Figure 2:
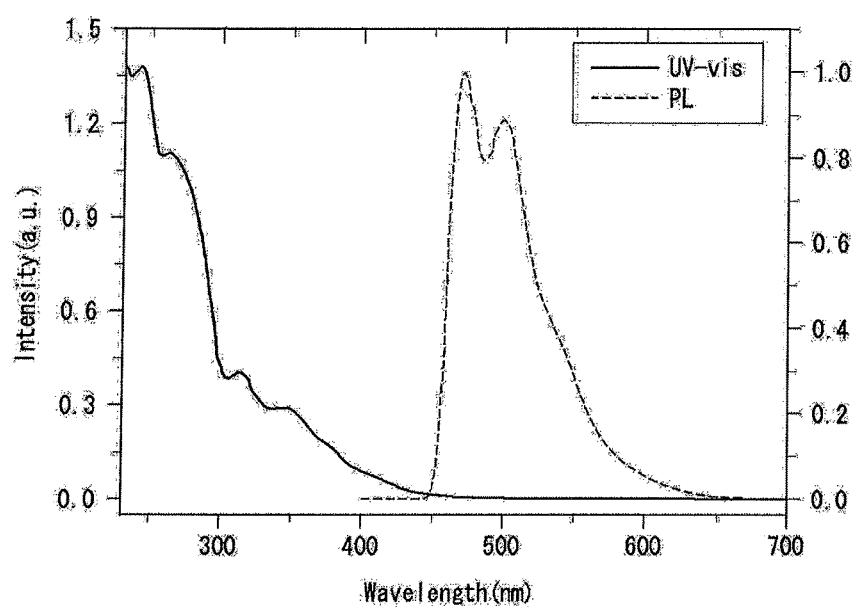
FIG. 2 is a graph showing UV-vis/PL spectra of Compounds B-7 prepared according to one synthetic example of the invention.
Figure 3:
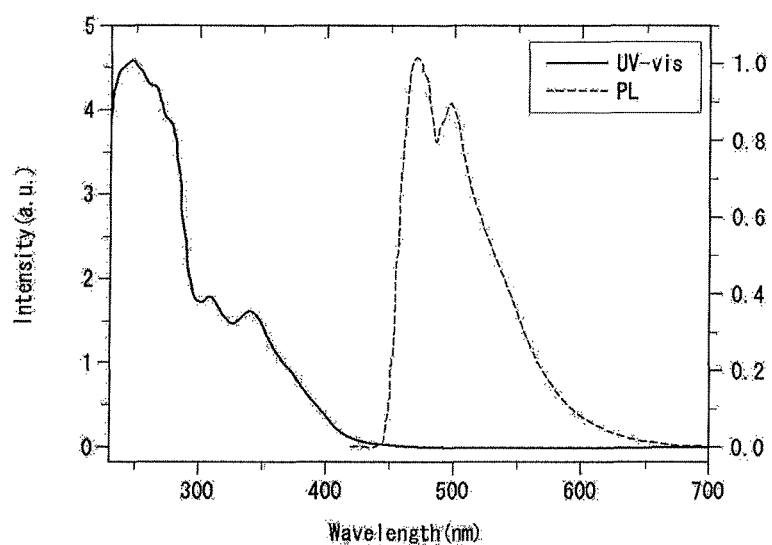
FIG. 3 is a graph showing UV-vis/PL spectra of Compounds B-13 prepared according to another synthetic example of the invention.
Figure 4:
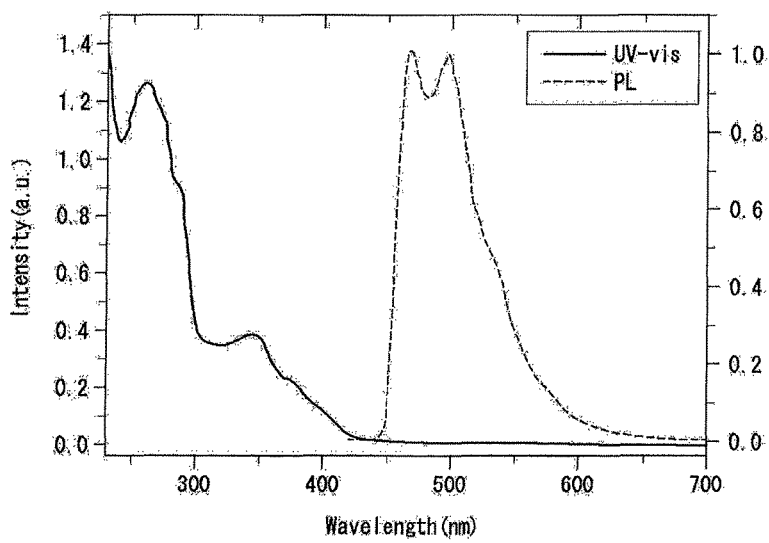
FIG. 4 is a graph showing UV-vis/PL spectra of Compounds B-17 prepared according to still another synthetic example of the invention.

Ultra violet-Photo luminescence (UV-vis/PL) spectra of the prepared compounds B-7, -13, and -17 were measured, and characteristics thereof are shown in FIGS. 2, 3, and 4.

Hereinafter, examples will be set forth in which light emitting diodes are manufactured by using, as a blue dopant, the foregoing compounds B-7, -13, and -17, and a blue phosphorescence compound, which is represented for a comparative example.

EXAMPLE 1

An ITO substrate was patterned to have a light emitting area of 3 mm×3 mm, and then washed. After the substrate was installed in a vacuum chamber, the base pressure was made to be 1×10-6 torr. Then, on the anode ITO, HAT-CN was formed with a thickness of 50 Å for a hole injection layer, NPD was formed with a thickness of 550 Å for a hole transport layer, TAPC was formed with a thickness of 100 Å for an electron blocking layer, and mCP having a thickness of 300☐ as a host and Compound B-7 having a doping concentration of 15% as a dopant were formed for a light emitting layer. Then, TmPyPb was formed with a thickness of 400 Å for an electron transport layer, LiF was formed with a thickness of 5 Å for an electron injection layer, and then Al was formed with a thickness of 1000 Å for a cathode, resulting in manufacturing an organic light emitting diode.

EXAMPLE 2

An organic electroluminescent display was manufactured under the same process conditions as the foregoing Example 1, only except that Compound B-13 was used as a dopant of a light emitting layer.

EXAMPLE 3

An organic electroluminescent display was manufactured under the same process conditions as the foregoing Example 1, only except that Compound B-17 was used as a dopant of a light emitting layer.

COMPARATIVE EXAMPLE

An organic electroluminescent display was manufactured under the same process conditions as the foregoing Example 1, only except that a compound represented by Chemical Formula below was used as a dopant of a light emitting layer.

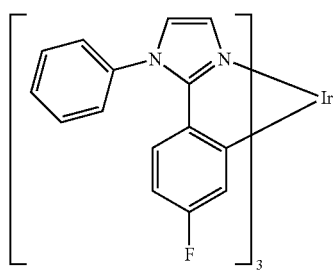

COMPARATIVE EXAMPLE

Voltages, currents, current efficiencies, power efficiencies, quantum efficiencies, and color coordinates of the organic light emitting diodes manufactured according to Examples 1 to 3 and the comparative example above were measured, and then tabulated in Table 1 below.

TABLE 1

|  | Voltage | Current | Current Efficiency | Power Efficiency | Quantum Efficiency | Color Coordinate | |
| --- | --- | --- | --- | --- | --- | --- | --- |
|  | (V) | (mA/cm$^2$) | (cd/A) | (lm/W) | (%) | CIE_x | CIE_y |
| Example 1 | 7.76 | 10 | 23.80 | 9.64 | 11.75 | 0.183 | 0.342 |
| Example 2 | 7.72 | 10 | 20.70 | 8.42 | 10.02 | 0.171 | 0.354 |
| Example 3 | 7.84 | 10 | 23.62 | 9.46 | 11.60 | 0.180 | 0.341 |
| Comparative Example | 7.86 | 10 | 12.75 | 5.10 | 6.7 | 0.195 | 0.333 |

Referring to Table 1, it can be confirmed that Examples 1 to 3, which respectively employ Compounds B-7, B-13, and B-17, showed significantly improved current efficiencies, power efficiencies, and quantum efficiencies while showing the same level of color coordinates, as compared with the comparative example.

As described above, according to the present invention, power efficiencies, current efficiencies, and quantum efficiencies of the organic light emitting diode can be improved by preparing a new blue phosphorescence compound and then using it as a dopant of the light emitting layer of the organic light emitting diode.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A blue phosphorescence compound represented by any one of Chemical Formulas below:

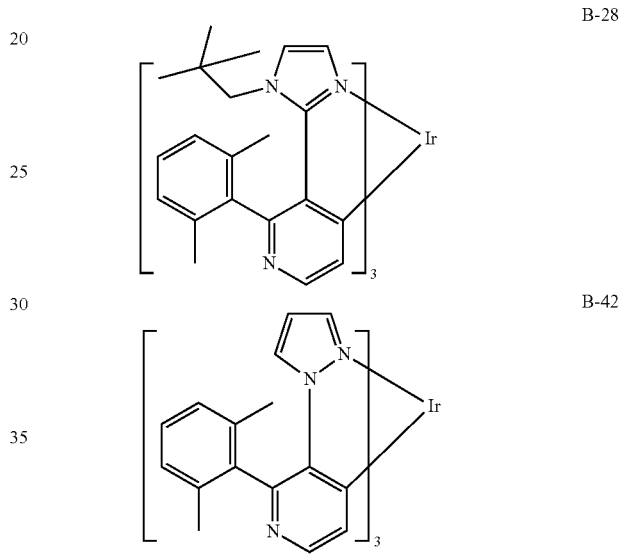

-continued

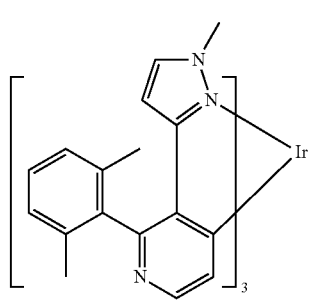

B-47
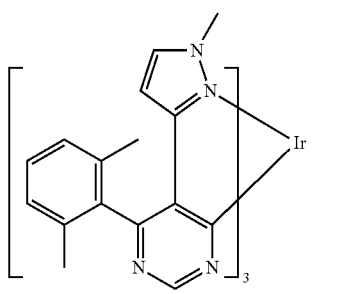
B-31
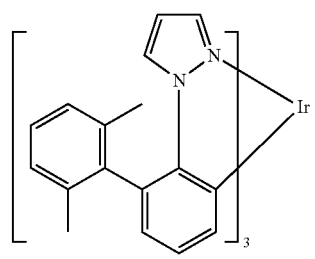
B-58
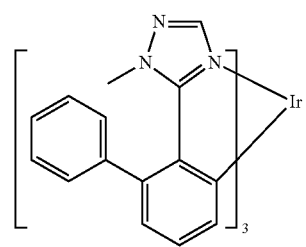
B-59
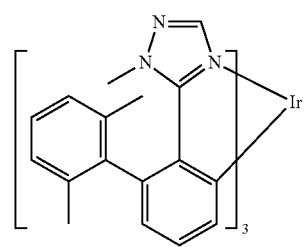
B-60
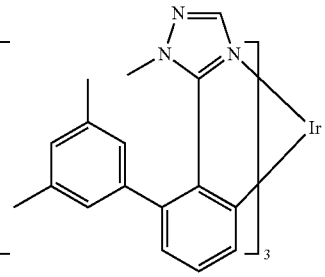
B-59
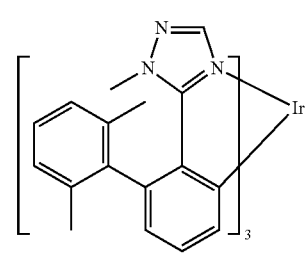
B-61
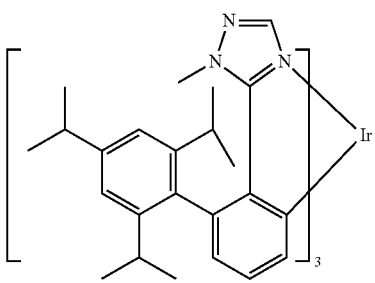
B-62
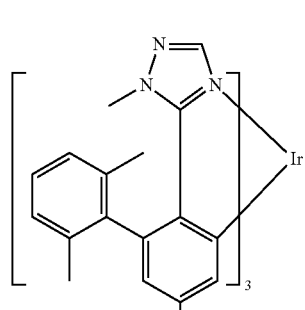
B-63
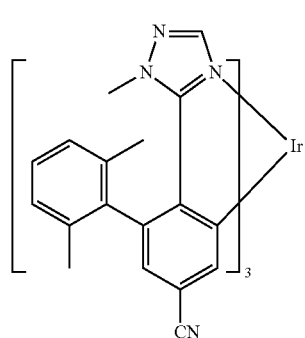
B-64
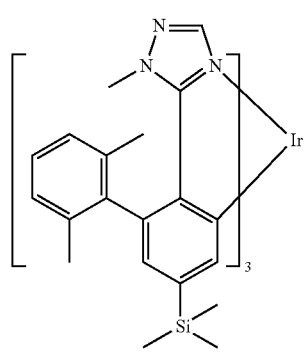
B-65
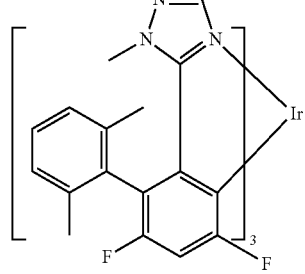

B-66
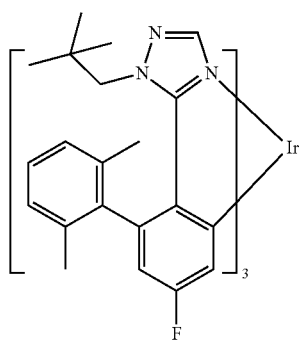
B-67
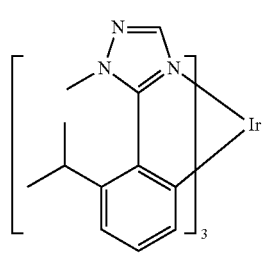
B-68
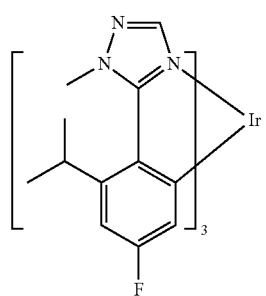
B-70
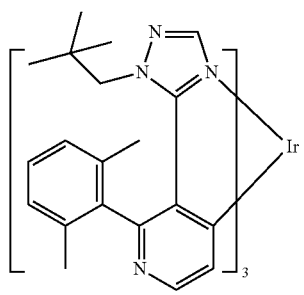
B-71
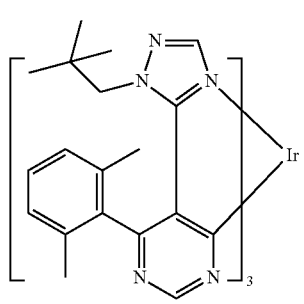
B-72
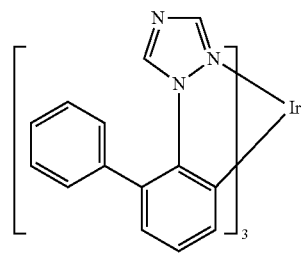
B-73
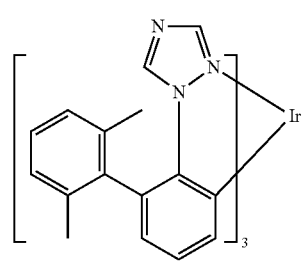
B-74
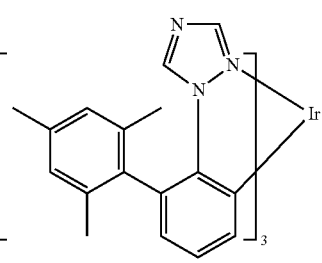
B-75
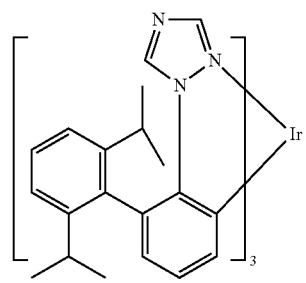
B-76
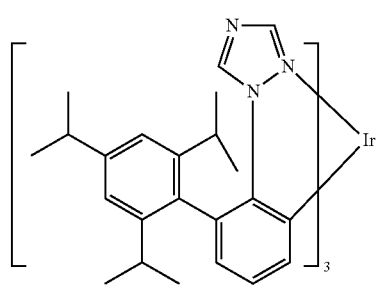

B-77 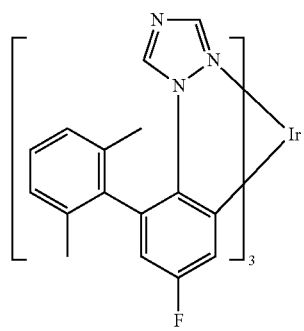
B-78 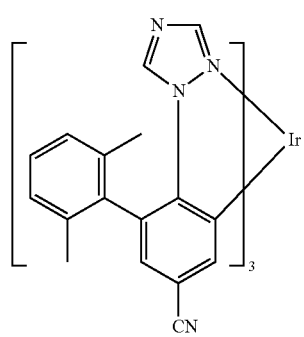
B-79 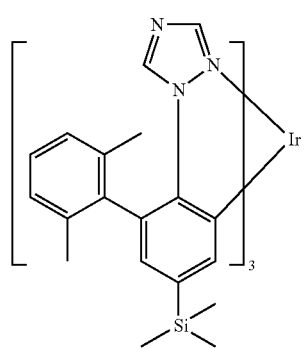
B-82 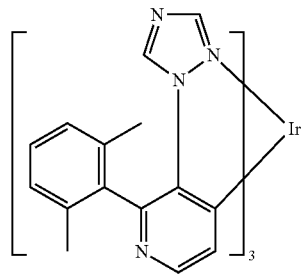
B-83 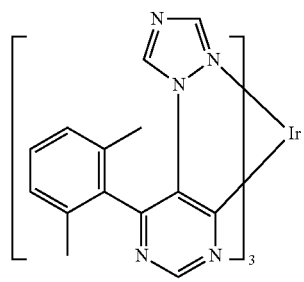
B-84 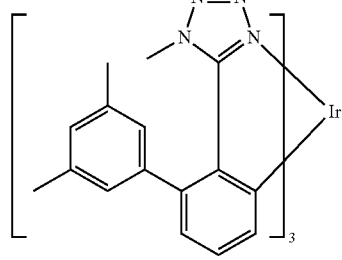
B-85 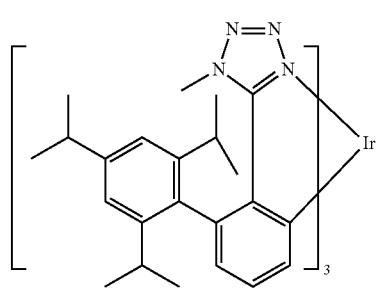
B-86 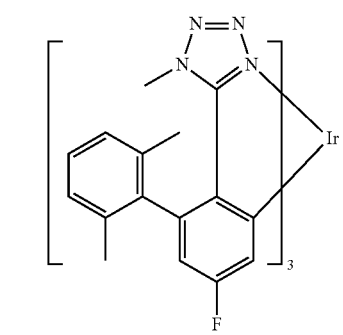
B-87 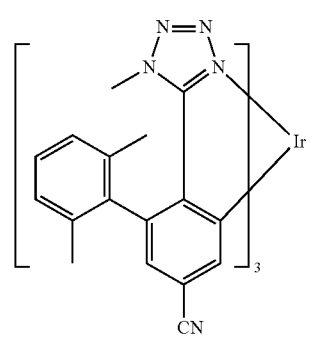
B-88 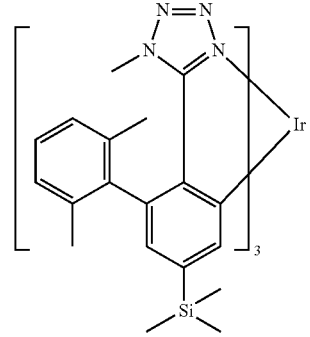

B-89

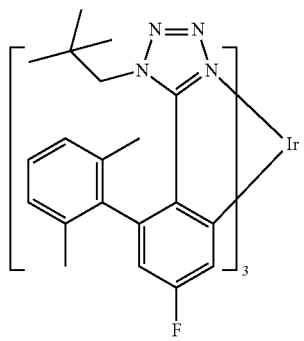

B-90

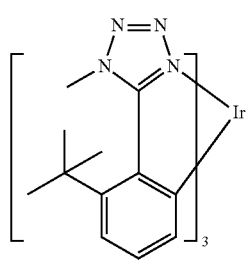

B-93

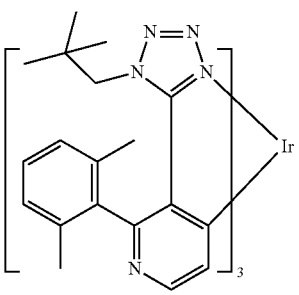

B-94

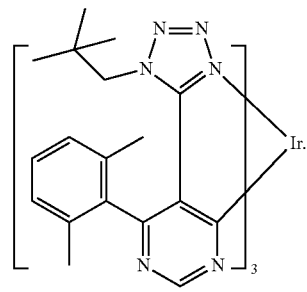

2. An organic light emitting diode having an organic film formed between an anode and a cathode, the organic light emitting diode comprising the compound of claim 1.

3. The organic light emitting diode of claim 2, wherein the organic film is a light emitting layer.

4. The organic light emitting diode of claim 3, wherein the compound is used as a dopant of the light emitting layer.

5. The organic light emitting diode of claim 3, wherein the dopant is doped at a weight ratio of 0.1 to 50% with respect to the light emitting layer.

6. The organic light emitting diode of claim 5, wherein the dopant is doped at a weight ratio of 1 to 20% with respect to the light emitting layer.

7. The organic light emitting diode of claim 2, further comprising any one selected from a hole injection layer, a hole transport layer, an electron transport layer, and an electron injection layer.

* * * * *